United States Patent
Fenigstein et al.

(10) Patent No.: US 9,729,808 B2
(45) Date of Patent: Aug. 8, 2017

(54) SINGLE-EXPOSURE HIGH DYNAMIC RANGE CMOS IMAGE SENSOR PIXEL WITH INTERNAL CHARGE AMPLIFIER

(71) Applicant: Tower Semiconductor Ltd., Migdal Haemek (IL)

(72) Inventors: Amos Fenigstein, Haifa (IL); Raz Reshef, Tel-Aviv (IL); Shay Alfassi, Ramot Menashe (IL); Guy Yehudian, Kfar Saba (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 186 days.

(21) Appl. No.: 14/822,666

(22) Filed: Aug. 10, 2015

(65) Prior Publication Data

US 2015/0350584 A1    Dec. 3, 2015

Related U.S. Application Data

(63) Continuation-in-part of application No. 13/797,862, filed on Mar. 12, 2013, now Pat. No. 9,106,851.

(51) Int. Cl.
*H04N 5/355*    (2011.01)
*H04N 5/374*    (2011.01)
(Continued)

(52) U.S. Cl.
CPC ..... *H04N 5/3742* (2013.01); *H01L 27/14612* (2013.01); *H01L 27/14643* (2013.01);
(Continued)

(58) Field of Classification Search
CPC .... H04N 5/3742; H04N 5/355; H04N 5/3559; H04N 5/3745; H04N 5/378; H01L 27/14643; H01L 27/14612
See application file for complete search history.

(56) References Cited

U.S. PATENT DOCUMENTS 5,742,047 A    4/1998    Buhler et al.
5,774,181 A    6/1998    Shyu et al.
(Continued)

FOREIGN PATENT DOCUMENTS

WO    2005/101816 A1    10/2005
WO    2008/103257 A1    8/2008

OTHER PUBLICATIONS

Kemna, A. et al.: "Low Noise, Large Area CMOS X-Ray Image Sensor for C.T. Application", 2003 IEEE, 0-7803-8133-5/03, pp. 1260-1265.
(Continued)

*Primary Examiner* — Tony Ko
(74) *Attorney, Agent, or Firm* — Bever, Hoffman & Harms, LLP

(57) ABSTRACT

A single-exposure high dynamic range (HDR) image sensor utilizes a charge amplifier having a selectively coupled conversion capacitor to read a single photodiode charge during a multi-phase readout operation. An overflow readout is performed during the photodiode charge integration phase, and utilizes the conversion capacitor to read overflow signals indicating rapidly rising photodiode charges caused by extreme exposure conditions, which also prevents saturation of the photodiode. At the end of the integration phase, the remaining photodiode charge is then measured using two readouts: a high sensitivity readout during which the storage capacitor de-coupled to accurately measure low-light conditions, and a low sensitivity readout during which the remaining photodiode charge is stored on the storage capacitor to provide normal light image data. Final single exposure HDR image data is then calculated by summing the overflow image data with the high-sensitivity and/or the low-sensitivity image data.

20 Claims, 9 Drawing Sheets

(51) Int. Cl.
   *H01L 27/146* (2006.01)
   *H04N 5/378* (2011.01)
   *H04N 5/3745* (2011.01)

(52) U.S. Cl.
   CPC .......... *H04N 5/355* (2013.01); *H04N 5/3559* (2013.01); *H04N 5/378* (2013.01); *H04N 5/3745* (2013.01)

(56) References Cited

U.S. PATENT DOCUMENTS

| | | |
|---|---|---|
| 6,351,283 B1 | 2/2002 | Liu |
| 7,075,049 B2 | 7/2006 | Rhodes et al. |
| 7,800,673 B2 | 9/2010 | Sugawa et al. |
| 8,203,111 B2 * | 6/2012 | Reshef .............. H01L 27/14609 250/208.1 |
| 8,969,821 B2 * | 3/2015 | Kim .................. H01L 27/14658 250/370.09 |
| 2006/0146159 A1 | 7/2006 | Farrier |
| 2006/0237631 A1 | 10/2006 | Koyama |
| 2008/0018764 A1 | 1/2008 | Mizoguchi |

OTHER PUBLICATIONS

Lahav, Assaf, et al.: "Enhances X-Ray CMOS sensor panel for Radio and Fluoro applications using a low noise charge amplifier pixel with a Partially Pinned PD", IISW 2011, 4 pages.

\* cited by examiner

SINGLE-EXPOSURE HIGH DYNAMIC RANGE CMOS IMAGE SENSOR PIXEL WITH INTERNAL CHARGE AMPLIFIER

RELATED APPLICATIONS

This application is a continuation-in-part of U.S. patent application Ser. No. 13/797,862 entitled "SINGLE-EXPOSURE HIGH DYNAMIC RANGE CMOS IMAGE SENSOR PIXEL WITH INTERNAL CHARGE AMPLIFIER" filed Mar. 12, 2013.

FIELD OF THE INVENTION

This invention relates to CMOS image sensors, and more particularly to High Dynamic Range (HDR) CMOS image sensors suitable for single exposure (e.g., X-Ray) applications.

BACKGROUND OF THE INVENTION

Sensor arrays are used, for example, in video cameras, and generally include a two dimensional array of pixels that is fabricated on a substrate. Each pixel includes a sensing element (e.g., a photodiode) that is capable of converting a portion of an optical (or other radiant source) image into an electronic (e.g., voltage) signal, and access circuitry that selectively couples the sensing element to control circuits dispose on a periphery of the pixel array by way of address and signal lines. In CMOS image sensors, which represent one type of sensor array, metal address and signal lines are supported in insulation material that is deposited over the upper surface of a semiconductor substrate, and positioned along the peripheral edges of the pixels to allow light to pass between the metal lines to the sensing elements through the insulation material. As with other sensor arrays, CMOS image sensors typically contain millions of pixels which transform photons coming from a photographed scene into millions of corresponding voltage signals, which are stored on a memory device and then read from the memory device and used to regenerate the optical image on, for example, a liquid crystal display (LCD) device.

Large area sensor arrays are used for medical imaging applications, and have many requirements that are not always applicable to "normal" (e.g., video camera) sensor arrays. First, large area image sensors must have pixel arrays that area much larger than "normal" arrays, both in the sense that the pixels are larger and total array area is very large. Second, large area sensor arrays must be able to operate in both a high resolution, low frame rate operating mode (e.g., to facilitate x-ray imaging) and in a low resolution, high frame rate operating mode (e.g., to facilitate scanning operation). In addition, high end analog performance such as noise and linearity is required. Finally, the cost of the large area sensor arrays must be minimal without performance compromise.

Conventional large area image sensors for medical x-ray applications are currently produced using a-Si:H technology and CMOS technology. Active Pixel TFT arrays that utilize a-Si:H technology typically include a 1T pixel including a photo-diode and a single transfer transistor. The TFT pixels typically transfer their charges to an off-chip charge amplifier (e.g., using one amplifier per column). A problem with this approach is that large arrays are sensitive to signal noise, and it is not possible using current a-Si:H technology to integrate a charge amplifier at the pixel level.

Large area CMOS image sensors overcome the problems associated with sensors that use a-Si:H technology in that the CMOS process allows for the inclusion of amplifier circuits within each pixel. However, some conventional large area CMOS image sensors utilize pixel level amplifiers that are formed in an integrator configuration, i.e., such that there is a current source per integrator. Therefore, a problem with this conventional large area CMOS image sensor approach is that power consumption may be too high for practical large pixel array applications. Other MOS based large area image sensors use charge amplifiers having complex circuitry and control signals that degrade production yields and, as a result, profitability. In addition, this complex circuitry reduces pixel fill-factor, which means less light will be collected and SNR will be degraded.

High dynamic range (HDR) imaging allows for high quality image with both low and high light conditions in the same scene. At least one conventional HDR imaging architecture, e.g., as described in U.S. Pat. No. 7,075,049, Rhodes, Dual Conversation Gain Imagers, utilizes a dual conversion gain approach to obtain the desired HDR imaging results under different lighting conditions i.e., see Rhodes claim 1. The conventional approach described in Rhodes is based on the well-known fully pinned 4T pixel scheme and not charge amplifier configuration. The implementation of an HDR scheme based on dual gain using fully pinned 4T scheme suffers from a few drawbacks. The process needed for fully pinned photodiode with good transfer characteristics is usually involved and expensive. It is hard to achieve large full well capacity, in the range of several hundred thousand electrons and more, which are needed for instance in X-ray applications, and the transfer time for large photodiodes in the range of tens of micrometers can be quite long (tens of microseconds) limiting the speed of the sensor. All those are removed in the present invention. The present invention preserves the low noise using partially pinned photodiode, and uses the dual gain in a similar way to achieve the high dynamic range performance. However, the partially pinned photodiode needs only two additional implant layers. Furthermore, the charge amplifier scheme transfer charge without the need to transfer the actual collected electrons in the diode as there are many free electrons in the diode area which is not pinned. This is much faster process and does not limit the sensor speed.

What is needed is a low cost, large area CMOS image sensor with high end analog performance that overcomes the problems associated with conventional large area image sensors while allowing for HDR performance.

SUMMARY OF THE INVENTION

The present invention is directed to a single-exposure high dynamic range (HDR) image sensor in which each pixel includes a photodiode coupled by way of a transfer gate to a (first) floating diffusion (FD) node, and a charge amplifier including a charge-to-voltage conversion capacitor that is coupled by way of a mode control switch between the FD node and a pixel output (second) node, wherein each photodiode charge is transferred from the photodiode to the FD node by way of the transfer gate at least twice during a multi-phase readout operation: during at least one (first) readout phase while the conversion capacitor is operatively de-coupled from the FD node, and during at least one (second) readout phases while the conversion capacitor is operatively coupled to the FD node. By operatively de-coupling the conversion capacitor during at least one of the multiple readout phases, the present invention provides a relatively small effective capacitance that facilitates accurately measuring relatively small photodiode charges. By operatively coupling the conversion capacitor during at least one readout phase, the present invention provides a relatively large effective capacitance at the FD node that facilitates accurately measuring relatively large photodiode charges, and also facilitates accurately measuring (reading) and relieving (i.e., drawing down) overflow charges. An overflow charge occurs when a given exposure generates a photodiode charge that is larger than the capacity of the photodiode. Not only are overflow charges impossible to accurately read (i.e., because there is no way to determine how much a given overflow charge exceeds the photodiode capacity), overflow charges can also skew otherwise usable image data by escaping (i.e. "overflowing") their photodiode and penetrating adjacent pixels. Thus, by selectively operatively coupling and de-coupling the conversion capacitor to provide HDR readout data for a single exposure (i.e., a single photodiode charge) in the manner described herein, the present invention both prevents overflow charge corruption and facilitates higher frame rate and reduced motion artifact compared to solutions which require two or more separate exposures. This single exposure HDR readout approach is also highly beneficial in applications, such as X-Ray procedures, where a minimum number of exposures is important (i.e., exposing patients to any more X-ray doses than necessary can be harmful).

According to an aspect of the invention, the charge amplifier of each pixel includes, in addition to the conversion capacitor, at least one high sensitivity capacitor that is connected or coupled between the first (FD) and second (pixel output) nodes. The high sensitivity capacitor is implemented either by a discrete capacitor structure (e.g., a metal-oxide-silicon (MOS) capacitor structure fabricated using known techniques) that is connected or coupled between the first (FD) and second (pixel output) nodes, or is implemented by the parasitic capacitances generated between the first and second nodes by the adjacent circuit structures. In either case, the conversion capacitor, which in all cases is implemented by a discrete (e.g., MOS or MiM) capacitor structure, is fabricated such that it has a higher capacitance than the high sensitivity capacitor, and therefore the conversion capacitor has a lower conversion gain (sensitivity) than the high sensitivity capacitor. In contrast, the conversion capacitor, has a higher capacitance than high sensitivity capacitor, and therefore a lower conversion gain (sensitivity). In one specific embodiment, the high sensitivity capacitor is implemented either by parasitic capacitance or by one or more (second) discrete capacitor structures that is/are connected between the first and second nodes, whereby the high sensitivity capacitor remains connected to the first (FD) node during all operating phases. In an alternative arrangement, the high sensitivity capacitor is implemented by one or more (second) discrete capacitor structures that is/are coupled between the first and second nodes by way of an additional mode control switch that is controlled by a separate mode control signal such that the high sensitivity capacitor can be selectively isolated during one or more of the operating phases.

According to an embodiment of the present invention, each pixel of the CMOS image sensor is configured using a common source configuration such that the voltage level generated on FD node of each pixel modifies an associated column current in order to generate an associated output voltage (readout signal) indicating the level of photodiode charge generated on the pixel's photodiode during each readout phase. In particular, the pixels are arranged in columns such that each column of pixels is coupled to a shared signal line that carries a signal current generated by an associated current source, and readout operations are performed for one pixel in each column at a time. In addition to the photodiode photodiode, the transfer gate and the charge amplifier (mentioned above) each pixel also includes a select switch connected between the signal line and a second (output) node of the pixel, and the charge amplifier of each pixel also includes an amplifier transistor connected between the second node and ground (first voltage source), and a gate terminal connected to the FD node. In accordance with an embodiment of the present invention, the charge amplifier includes an NMOS amplifier transistor that is coupled between the signal line and ground by way of the select switch. By referencing both the photodiode and the NMOS amplifier transistor to the same local ground potential, the gate-to-source noise in the NMOS amplifier transistor is made very low, thereby facilitating high end analog performance. With this arrangement, each readout operation involves actuating the select switch to operably couple the signal line to the second node while the amplifier transistor is actuated by the FD node (readout) voltage stored on the FD node at that time, whereby an amount of the signal current is passed through the amplifier transistor in accordance with the FD node voltage, thereby generating a readout signal on the signal line that indicates the amount of photodiode charge generated at that time, which in turn provides image data that can be used in combination with image data generated by other pixels to reproduce a captured image. By implementing the present invention utilizing a common source configuration, the resulting amplifier circuit is made small and simple, thereby maximizing pixel fill-factor and reducing yield loss. By utilizing one current source per column of pixels, the present invention reduces power consumption over conventional large area arrays that use integrator-type amplifier circuits. Accordingly, the present invention provides an arrangement that is suitable for producing low cost, large area, high resolution HDR CMOS image sensors having high end analog performance (i.e., low noise and high linearity) that are optimal, for example, for use in medical applications.

According to an embodiment, the control circuit of the HDR image sensor is configured to perform a multi-phase readout operation from each pixel to generate a high sensitivity (first) readout signal during a high sensitivity (first) readout phase while the conversion capacitor is operatively de-coupled from the FD node, and configured to generate at least one additional (second) readout signal (i.e., an overflow readout signal and/or a low sensitivity readout signal) before and/or after the high sensitivity readout phase while the conversion capacitor is operatively coupled from the FD node. In one embodiment, the multi-phase readout operation only includes the high sensitivity (first) and low sensitivity (second) readout operations that are performed to read final versions of each photodiode charge (i.e., after the integration phase of each integration/readout cycle is completed). In another embodiment, the multi-phase readout operation includes the high sensitivity (first) and the overflow (second) readout operations, where the overflow readout is performed during the integration phase (e.g., near the beginning, halfway between the beginning and end, or near the end of the integration phase) to read a partial version of a photodiode charge, and then the high sensitivity readout operation is performed to read the final version of the photodiode charge (i.e., after the integration/exposure phase has ended). In a presently preferred embodiment, all three readout operations are performed for each integration/readout cycle, with the overflow readout operation being performed during the integration phase to read partial (incomplete) versions of the photodiode charge captured by each pixel, and the high sensitivity and low sensitivity readout operations being performed after the integration phase to read the final version of the photodiode charge captured by each pixel. Although two of the three readout operations may be utilized to provide single-exposure HDR image data, by performing all three (i.e., overflow, high sensitivity and low sensitivity) readout operations during/after each integration/readout cycle, the present invention provides a single-exposure image sensor exhibiting superior performance both in the range of measurable light brightness and in the accuracy of the image data produced.

According to another embodiment of the present invention, each pixel also includes a bias circuit that is configured to generate a continuous nominal bias voltage (higher than 0V) on the FD node whenever the FD node would otherwise be floating (e.g., during integration/exposure phase when the photodiode is operatively de-coupled from the FD node) in order to prevent the FD node from being pulled to ground during this time by way of capacitive coupling, thereby assuring charge overflow to the FD node during the overflow readout phase, as discussed below. In one specific embodiment, the bias circuit is implemented by a current source configured to generate a small leakage current on the second node that passes through the amplifier transistor, thereby generating the nominal bias voltage on the FD node. In another specific embodiment, the bias circuit is implemented using a capacitor divider approach by connecting a capacitor between the FD (first) node and ground. In yet another specific embodiment, the bias circuit is implemented using another capacitor divider approach by connecting a capacitor between the FD node and a system voltage source (e.g., VDD). These capacitor divider approaches allow the common source drain to fall to ground (0V) while holding the first (floating diffusion) node above ground.

In accordance with a disclosed specific embodiment of the present invention, each pixel operates in accordance with control signals transmitted from the sensor's control circuit to perform pre-integration, integration and readout operating phases during each integration/readout cycle such that a first portion of the readout operation (i.e., the overflow readout phase) is performed during the integration operating phase (i.e., while charge is accumulating in the photodiode), and a second portion of the readout operation (i.e., the high sensitivity readout phase and the low sensitivity readout phase) are performed after the integration phase has ended (i.e., after a final photodiode charge has been captured by the photodiode).

During the pre-integration operating phase of each integration/readout cycle, the sensor's control circuit asserts the control signals such that the reset transistor, the transfer gate, the select switch and the mode control switch are turned on. In this operating state the gate-to-source voltage of the NMOS amplifier transistor are equal (e.g., both held at 1V), which causes the NMOS amplifier transistor to function as a diode that produces a reset current between the photodiode and ground, thereby resetting the photodiode charge. This approach limits column current and provides large signal voltage ranges.

At the end of the pre-integration operating phase and beginning of the integration phase the transfer gate is actuated (turned off), thereby isolating the photodiode such that the photodiode charge begins to increase at a rate determined by the amount of received light (i.e., at a slower rate for dim light, and at a faster rate for brighter light). In addition, the select switch and the reset transistor are actuated (turned off), thereby isolating the FD node and the pixel output node, but the mode control switch remains on (i.e., the conversion capacitor remains coupled to the FD node). To prevent undesirable leakage from the photodiode through the transfer gate under these conditions, the bias voltage circuit (mentioned above) functions to maintain a non-zero gate voltage on the NMOS amplifier transistor. The entire internal pixel circuitry is thus made small and simple, thereby maximizing pixel fill-factor and reducing yield loss.

According to an embodiment of the present invention, an overflow readout process is performed during the later portion of the integration phase to detect and measure an overflow charge generated on the photodiode of each pixel. In an exemplary embodiment, the overflow readout process begins by switching the transfer gate to a partially-on state using an intermediate (slightly elevated above 0V) transfer gate control voltage, where the intermediate transfer gate control voltage is set such that the transfer gate is partially (e.g., less than half-way) turned on, and then the select switch is turned on to couple the pixel output (second) node to the signal line. With this arrangement, the FD node voltage generated on the FD node during the overflow readout phase is either (a) the continuous nominal bias voltage when the partial version of the photodiode charge is less than a predetermined charge value (i.e., the partial version is insufficient to overcome the potential barrier formed by the partially turned-on transfer gate), or (b) an overflow voltage level that is proportional to the charge amount by which the photodiode charge exceeds the predetermined charge value when the partial version of the photodiode charge is greater than the predetermined charge value, which occurs when the amount of received light would otherwise saturate (overflow) the photodiode's capacity during the full integration period. The resulting overflow readout signal generated on the column signal line is then sampled and stored. Note that, by operatively coupling the relatively large conversion capacitor to the FD node during the overflow readout phase, the conversion capacitor is utilized as an overflow capacitor (i.e., in addition to its use for generating high sensitivity readout values, as discussed below) that prevents overflow charges from leaking into adjacent pixels. In addition, the conversion capacitor provides sufficient capacity to operatively generate both the overflow readout signal and the subsequently generated low sensitivity readout signal. The transfer gate is returned to a fully turned off state at the end of the overflow readout phase, thereby isolating the photodiode such that the final photodiode charge accumulated at the end of the integration period may have a charge value greater than the predetermined charge value.

Near the end of the integration phase, a reset readout phase is performed to read a reset level readout signal is later used to generate highly accurate correlated double sampling (CDS) image data. With the transfer gate fully off (i.e., the photodiode isolated from the FD node), the mode control transistor fully-on (i.e., the conversion capacitor operatively coupled to the FD node) and the select switch fully-on (i.e., the pixel output node operatively coupled to column signal line), the reset transistor is turned on to operatively couple the FD node to the pixel output node, thereby causing the amplifier transistor to operate as a diode that drains charges stored on the two capacitors. The resulting reset readout signal generated on the column signal line is then sampled and stored.

The high sensitivity readout phase then begins by turning off the reset transistor and the mode control switch turning on the transfer gate to transfer the final photodiode charge from the photodiode to the high sensitivity capacitor, thereby converting the photodiode charge to a high sensitivity voltage. The resulting high sensitivity readout signal is then sampled by readout circuitry connected to the signal line (i.e., external to the pixel).

The low sensitivity readout phase is the last phase of the multi-phase readout process, and begins by actuating (turning on) the mode control switch to couple both the high sensitivity capacitor and the low sensitivity capacitor to the FD node, then toggling the transfer gate to transfer the final photodiode charge from the photodiode to FD node, thereby generating a low sensitivity readout voltage on the signal line voltage. The resulting low sensitivity readout signal is then sampled by the readout circuitry connected to the signal line (i.e., external to the pixel).

A final HDR image value is then generated for the single photodiode charge using readout (or other logic) circuitry by processing the readout signals generated during the multi-phase readout operation using a selected data processing technique. In one specific embodiment, the final HDR image value is generated by summing the overflow (second) readout signal with at least one of the high sensitivity (first) readout signal and the low sensitivity (third) readout signal. According to a preferred embodiment, the sample-and-hold (S&H) reset value is subtracted from the overflow readout signal to provide a double sampling (DS) overflow image data value. The S&H reset value is also utilized to provide highly accurate correlated double sampling (CDS) image data values for the high sensitivity and low sensitivity readout signals. In one embodiment, the final HDR image value is generated using a weighted average of the high and low sensitivity readout signals for each photodiode charge using a weighting formula, and then combining the adjusted values. Alternatively, the high sensitivity image data value may be utilized (alone) as the final HDR image value for photodiode charges below a predetermined light threshold, using the low sensitivity image data value as the final HDR image value for photodiode charges above that light threshold but below overflow levels, and using a sum of the overflow and one of the high or low sensitivity values for charges greater than the photodiode's capacity (i.e., above the overflow level).

According to yet another embodiment of the present invention, the image sensor uses a partially pinned photodiode (PPPD) structure including, in addition to an n-type photodiode implant region inside a p-type bulk, another shallow p-doped layer, known as a pinning implant layer over most of the n-type region. Only a small region surrounding the anode contact is left without the pinning layer. The pinning layer is grounded to the bulk. The n-type doping level is tuned such that close to reset voltage level the depletion regions of the two junctions, namely the n-type region junction with the bulk, and the n-type junction with the pinning layer coincide and leave the whole n-type region fully depleted, except for a small region surrounding the contact. Because further change in the anode voltage cannot modulate the depletion region in the full depleted area (also known as the "pinned area"), differential capacitance of the partially pinned photodiode vastly dropped at the pinning voltage. Such PPPD structures have the advantage of high capacitance for voltages lower than the pinning voltage, enabling large full well, and very low capacitance at voltages near the reset voltage such that kTC reset noise is minimized.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in High Dynamic Range (HDR) CMOS image sensors. The following description is presented to enable one of ordinary skill in the art to make and use the invention as provided in the context of a particular application and its requirements. The terms "coupled" and "connected", which are utilized herein, are defined as follows. When referring to the position of an element within a circuit, the term "connected" is used to describe a direct connection between two circuit elements, for example, by way of a metal line formed in accordance with normal integrated circuit fabrication techniques, and the term "coupled" is used to describe either a direct connection or an indirect connection in a signal path between two circuit elements. For example, two coupled elements may be directly connected by way of a metal line, or indirectly connected by way of an intervening circuit element (e.g., a capacitor, resistor, inductor, or by way of the source/drain terminals of a transistor). In contrast, the phrase "operatively coupled" is used to describe an essentially closed-circuit connection between two nodes by way of one or more intervening turned-on transistors, and the phrase "operatively-decoupled" is used to describe an essentially open-circuit connection between two nodes by way of one or more turned-off transistors. For example, a capacitor is operatively coupled to a node when an intervening NMOS transistor is turned on by way of a high gate voltage, and the capacitor is operatively de-coupled from the node when the intervening NMOS transistor is turned off by way of a low gate voltage. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
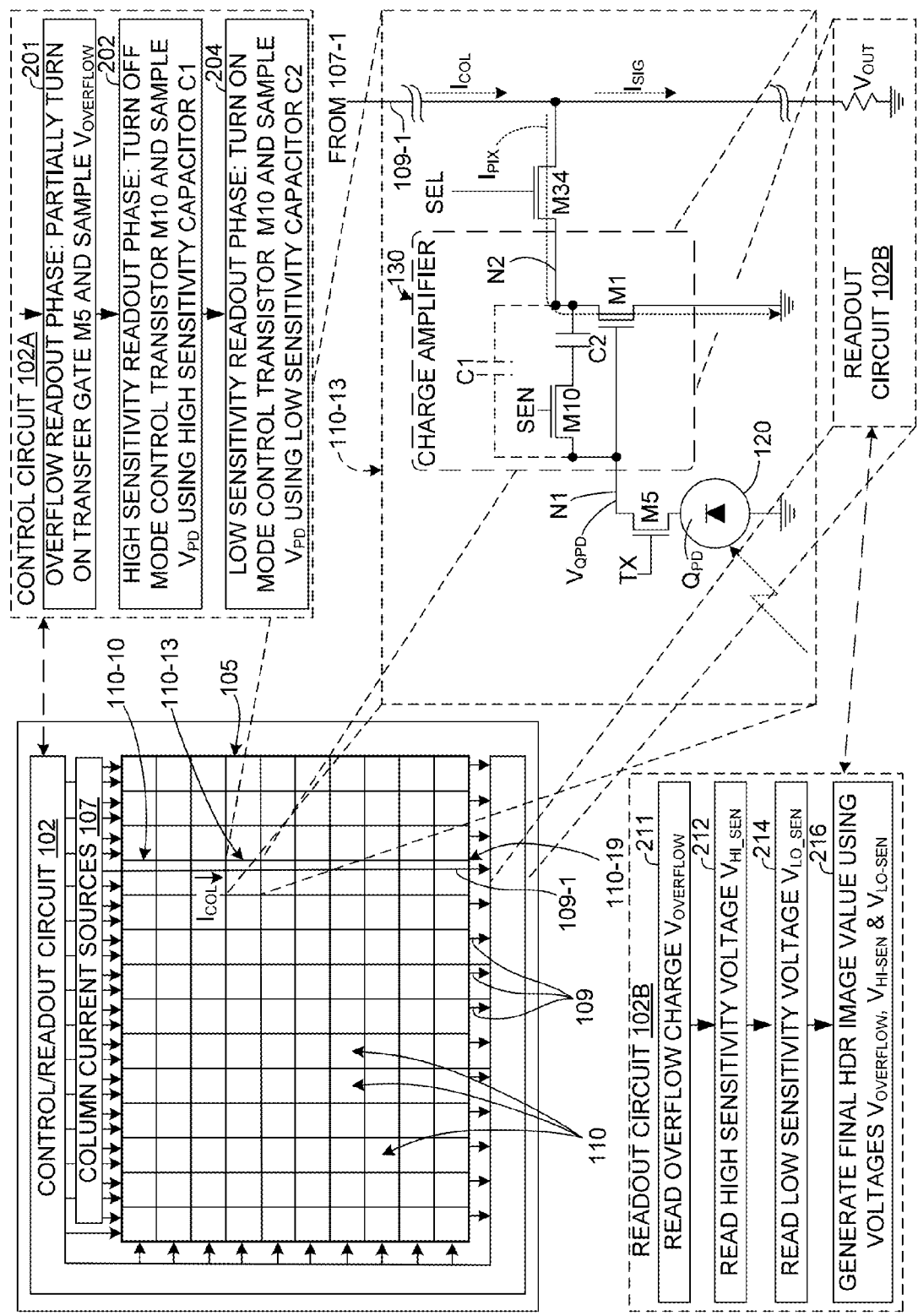
FIG. 1 is a simplified perspective diagram showing a CMOS image sensor according to an embodiment of the present invention.

FIG. 1 is a simplified diagram showing a single-exposure HDR CMOS image sensor 100 formed in accordance with a generalized embodiment of the present invention. CMOS image sensor 100 is similar to conventional CMOS image sensors in that it includes a pixel array 105 including pixels 110 arranged in rows and columns, and control/readout circuitry 102 that access, control and process signals received from each of the pixels by way of associated metal lines passing between the rows and columns of pixels 110. A simplified pixel 110-13, which is exemplary of all pixels 110, is shown in an enlarged fashion in the lower right portion of FIG. 1. Similar to conventional CMOS image sensors, each pixel 110 of CMOS image sensor 100 (e.g., pixel 110-13 includes at least one CMOS photodiode 120 and a transfer gate M5 coupling photodiode 120 to (first) floating diffusion (FD) node N1. CMOS photodiode 120 is fabricated on a semiconductor (e.g. silicon) substrate using known techniques and is configured to generate a photodiode charge $Q_{PD}$ in accordance with a corresponding image portion that is selectively transferred to FD node N1 by way of transfer gate M5, which is controlled using a control signal TX generated by control/readout circuitry 102 in the manner described below. Control/readout circuit 102 includes control circuit 102A (depicted functionally by the block/flow diagram shown in the upper right portion of FIG. 1) and readout circuit 102B (depicted functionally by the block/flow diagram shown in the lower left portion of FIG. 1). Reset, integration and multi-phase read operations of pixels 110 are initiated using select control signals and other control signals generated by control/readout circuit 102 according to timing characteristics described in further detail below, and transmitted to pixels 110 utilizing addressing schemes understood by those skilled in the art.

According to an aspect of the present invention, each pixel 110 also includes an internal charge amplifier 130 including a charge-to-voltage conversion capacitor C2 and a mode control switch M10. Conversion capacitor C2 is a discrete capacitor structure (e.g., either a metal-oxide-silicon (MOS) capacitor or any other VLSI capacitor, such as a metal-insulator-metal (MiM) capacitor) that is fabricated using techniques known in the art, and has a first terminal connected to a pixel output (second) node N2 and second terminal connected to one terminal of mode control switch M10. Mode control switch M10 is a MOS-type (e.g., NMOS) transistor structure connected between conversion capacitor C2 and FD node N1, and is actuated by a mode control signal SEN that is generated by control circuit 102A during read operations. Each charge amplifier 130 also includes at least one high sensitivity capacitor C1 that is connected or coupled between nodes N1 and N2 (i.e., between the FD node N1 and pixel output node N2 of pixel 110-13). High sensitivity capacitor C1 is illustrated in FIG. 1 using dotted lines to indicate that the associated capacitance can be provided by a discrete capacitor structure formed using known techniques and connected by associated conductive structures into the circuit, or the parasitic capacitance generated by the circuit between FD node N1 and output node N2. In either case, high sensitivity capacitor C1 has a lower capacitance than conversion capacitor C2, and therefore has a higher conversion gain (sensitivity). In contrast, capacitor C2, which is in all cases a discrete (e.g., MOS or MiM) capacitor structure that is fabricated using techniques known in the art, has a higher capacitance than capacitor C1, and therefore a lower conversion gain (sensitivity).

According to yet another aspect, the effective capacitance of charge amplifier 130 is controlled by operatively coupling/de-coupling conversion capacitor C2 from FD node N1 by way of mode control switch M10, which is actuated (turned on/off) by a mode control signal SEN generated by control circuit 102A. In particular, as indicated by block 202 located in the top right portion of FIG. 1, during a high sensitivity (first) readout phase, mode control switch M10 is actuated (i.e., turned-off) to operatively de-couple conversion capacitor C2 from FD node N1, and transfer gate M5 is actuated such that a (first) FD node voltage $V_{QPD}$ is generated on FD node N1 (i.e., stored only on capacitor C1) in accordance with the photodiode charge $Q_{PD}$ generated on photodiode 120 at the time of the first readout phase, thereby producing a high sensitivity (first) readout signal on signal line 109-1. In addition, during a second readout phase including either an overflow readout performed after the high sensitivity readout phase, as depicted by block 201, or a low sensitivity readout performed after the high sensitivity readout phase, as depicted by block 204, the mode control switch M10 is actuated (turned-on) to operably couple capacitor C2 to FD node N1, and then transfer gate M5 is actuated (fully or partially turned on) such that a second voltage generated on FD node N1 is at least partially stored on conversion capacitor C2 (and on C1 in the embodiment depicted in FIG. 1), thereby producing either an overflow or low sensitivity (second) readout signal on signal line 109-1. Note that coupling capacitor C2 to FD node N1 increases the total capacitance of FD node N1 (i.e., because capacitor C1 is connected in parallel with capacitor C1), which causes photodiode charge $Q_{PD}$ to be stored on both capacitors C1 and C2. As explained in detail below, by operatively coupling conversion capacitor C2 during at least one readout phase, the present invention provides a relatively large FD capacitance that facilitates accurately measuring relatively large photodiode charges, including overflow charges. By operatively de-coupling capacitor C2 during the high sensitivity readout phase, pixel 110-13 is configured to have the relatively small effective FD capacitance provided by capacitor C1 that facilitates accurately measuring relatively small (e.g., low-light) photodiode charges. By coupling and de-coupling capacitor C2 to FD node N1 during high sensitivity and overflow/low sensitivity readout operations, respectively, that are performed during each integration/readout cycle (i.e., such that a single photodiode charge is sampled/read multiple times), the present invention allows for high dynamic range (HDR) sensor operations that exhibit higher frame rate and reduced motion artifact compared to solutions which require two or more separate exposures.

According to an embodiment of the present invention, each pixel 110 of sensor 100 is configured using a common source configuration such that a column current $I_{COL}$ supplied by column current sources 107 is modified by the voltage stored on FD node N1 of each pixel 110 to generate output voltage readout signals indicating the level of photodiode charge $Q_{PD}$ generated on photodiode 120 of each pixel 110. For example, signal current $I_{SIG}$ is generated on signal line 109-1 by signal source 107-1 and is supplied to pixels 110-10 to 110-19, which forms a column including pixel 110-13. Each of pixels 110-10 to 110-19 includes a select switch that is connected between signal line 109-1 and the pixel's output node. For example, 110-13 includes a select switch M34 (depicted as an NMOS transistor) that is connected between signal line 109-1 and node N2. In addition, the charge amplifier of each pixel 110-10 to 110-19 includes an amplifier transistor connected between the pixel's output node and ground (first voltage source) and having a gate terminal connected to the pixel's FD node. For example, pixel 110-13 includes an NMOS amplifier transistor M1 having a first terminal connected to node N2, a second terminal connected to ground, and a gate terminal connected to FD node N1. With this arrangement, photodiode charge $Q_{PD}$ is applied to the gate terminal of NMOS transistor M1. During the high sensitivity (first) readout phase, select switch M34 is actuated (turned-on) to operably couple signal line 109-1 to the node N2, whereby a high sensitivity (first) readout signal is generated on signal line 109-1 in accordance with the voltage present on FD node N1. Similarly, during the overflow readout and low sensitivity readout phases, select switch M34 is actuated (turned-on) to operably couple signal line 109-1 to the node N2, whereby either an overflow readout signal or a low sensitivity readout signal (second readout signal) is generated on signal line 109-1 in accordance with the voltage present on FD node N1. NMOS transistor M1 thus functions as an amplifier with a closed-loop capacitive feedback its source terminal (connected to ground) serving as a positive input and its gate terminal serving as a negative input terminal and "virtual ground" node. The only minor changes in gate voltage of NMOS transistor M1 are due to finite gain of the common source amplifier implemented by NMOS transistor M1. For example, to produce a given change "X" on signal line 109-1, the charge on FD node N1 needs to change by X/A, where A is the open loop gain of charge amplifier 130. Since the gate voltage of NMOS transistor M1 stays almost constant, the charge on FD node N1 is coupled in an inverted manner to node N2 while being converted to voltage through capacitor C1 (or capacitors C1 and C2), which are selectively coupled between signal line and photo-diode (i.e., the feedback of the common source amplifier) in the manner described herein. By implementing charge amplifier 130 utilizing NMOS amplifier transistor M1 configured in this manner, amplification of photodiode charge $Q_{PD}$ is achieved with minimal circuitry, thereby maximizing pixel fill-factor and reducing yield loss. In addition, by referencing both photodiode 120 and NMOS transistor M1 to the same local ground potential, the gate-to-source noise in the NMOS transistor M1 is minimized, thereby facilitating high end analog performance.

Figure 7:
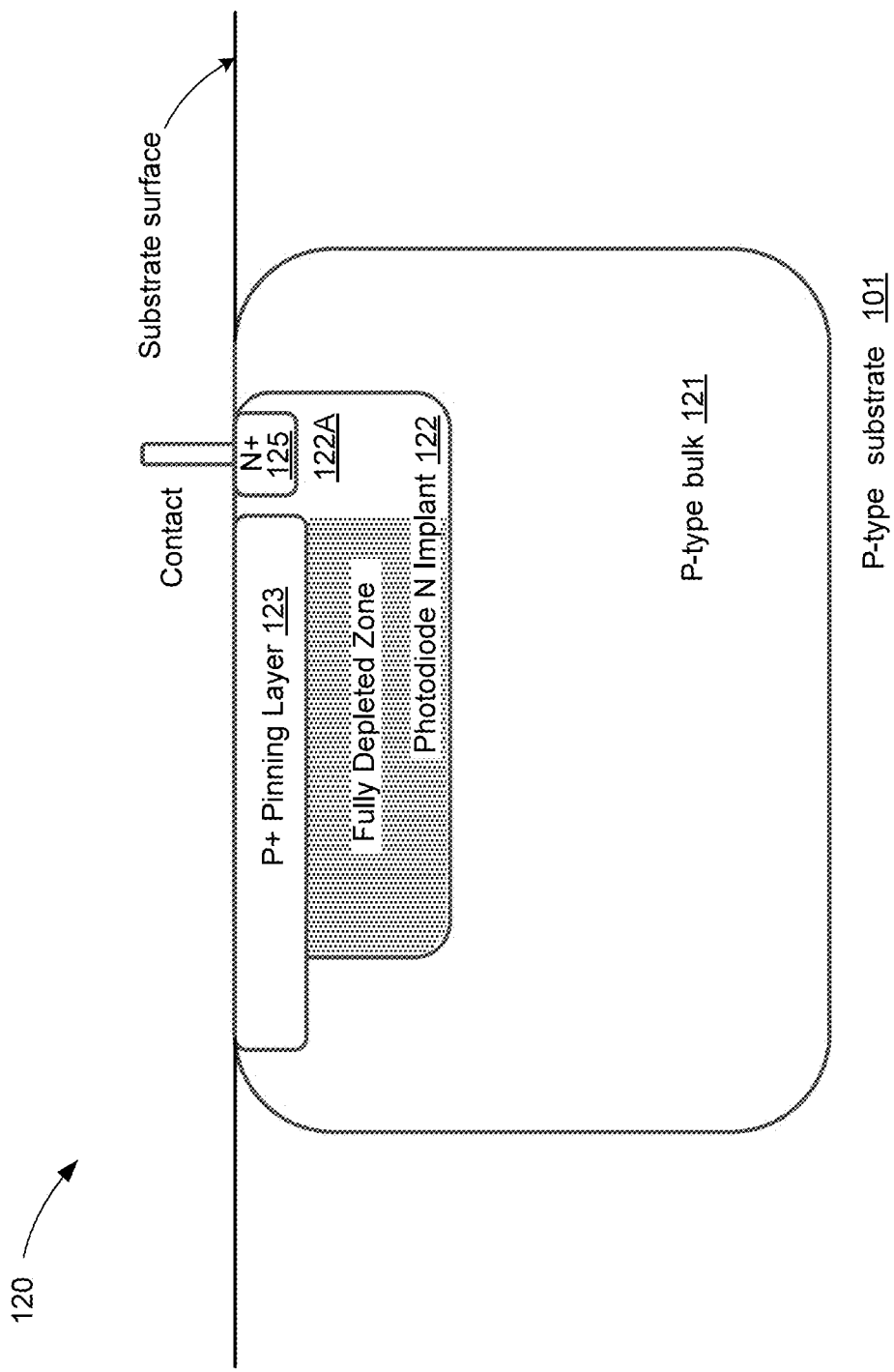
FIG. 7 is a simplified cross-sectional side view showing an exemplary pinned photodiode utilized in accordance with another specific embodiment of the present invention.

According to an embodiment of the present invention, photodiode 120 of each pixel 110 is formed such that the diode capacitance of each photodiode is non-linear (i.e., such that each photodiode's differential capacitance is very low at the reset level to reduce kTC noise, and is much higher for lower voltages in order to have high full well capacitance). In accordance with a specific embodiment, in order to achieve this goal, photodiode 120 is formed using a partially pinned photodiode (PPPD) structure, such as that depicted in FIG. 7. PPPD 120 is formed by doped regions implanted into substrate 101 and includes, in addition to an n-type photodiode implant region 122 formed inside a p-type bulk region 121, another shallow p-doped layer, known as a pinning implant layer 123, which is disposed over most of n-type region 122 and is ground to bulk region 121. N-type region 122 includes a small region 122A that bypasses pinning implant layer 123 and contacts N+ anode contact 125. As indicated by the shaded "Fully Depleted Zone" portion of FIG. 7, the n-type doping level is tuned such that, close to the reset voltage level, the depletion regions of the two junctions, namely the n-type region junction with the bulk, and the n-type junction with the pinning layer coincide and leave the whole n-type region fully depleted, except for a small region surrounding the contact. Because further change in the anode voltage cannot modulate the depletion region in the full depleted area (also known as the "pinned area"), differential capacitance of the partially pinned photodiode vastly drop at the pinning voltage. Such PPPD structures have the advantage of high capacitance for voltages lower than the pinning voltage, enabling large full well, and very low capacitance at voltages near the reset voltage such that kTC reset noise is minimized.

As indicated by block 201 located in the top right portion of FIG. 1, according to another embodiment of the present invention, conversion capacitor C2 is further utilized during each integration/readout cycle to detect and measure overflow charges that may be generated on photodiode 120 when exposed to extreme brightness conditions. Similar to the low sensitivity readout process described above, the overflow (second) readout process involves controlling (turning on) mode control by way of asserting control signal SEN to operably couple capacitor C2 to FD node N1, and actuating transfer gate M5, whereby an associated (second) voltage is generated on FD node N1 that is at least partially stored on conversion capacitor C2. However, in this case, the overflow readout process is performed during integration (i.e., before the final photodiode charge measured by the high sensitivity readout and low sensitivity readout processes, mentioned above, is generated on photodiode 120), and the actuation of transfer gate M5 includes turning transfer gate M5 partially on using a slightly elevated gate voltage (e.g., generating control signal TX at a level between 0.1V and 0.5V) during the integration process. The basic idea is to leave transfer gate M5 partially on during the integration phase so that, during integration, overflow charge (if any) is being spilled into FD node N1, which has high capacity due to capacitor C2 being coupled to FD node N1 by way of mode control switch M10. The resulting overflow charge generates an associated voltage on FD node N1 that is read (measured) using a separate sample-and-hold readout process before the high sensitivity and low sensitivity readout processes mentioned above. By utilizing this readout process to sample partial photodiode charges during each integration phase (i.e., by measuring a portion of the light sensed by photodiode 120 during each integration/readout cycle that is subsequently measured using the high/low sensitivity readout processes mentioned above), the present invention also utilizes the large capacitance of capacitor C2 as an "overflow" capacitor to further facilitate high dynamic range operation by generating useful data even in overflow conditions. That is, when an overflow condition does not occur, the high sensitivity and low sensitivity readout data signals can be utilized as described above to provide highly accurate image data values. In contrast, when an overflow condition occurs, the high sensitivity and low sensitivity readout data signals only confirm that the photodiode capacity has been exceeded, but cannot be used to determine the amount by which the capacity has been exceeded (i.e., the actual amount of light received). By utilizing the overflow readout process described herein, the resulting overflow readout value provides a way to predict (calculate) the amount by which the maximum photodiode charge was exceeded, thus further expanding the range of brightness detectable by sensor 100. Accordingly, by providing each pixel 110 with capacitor C2 that is selectively operatively coupled and de-coupled from FD node N1 by way of mode control switch M10 during and after the integration phase, the present invention provides an even higher dynamic range than that achieved using the high and low sensitivity readouts alone, while providing the higher frame rate and reduced motion artifact characteristics mentioned above.

Figure 2:
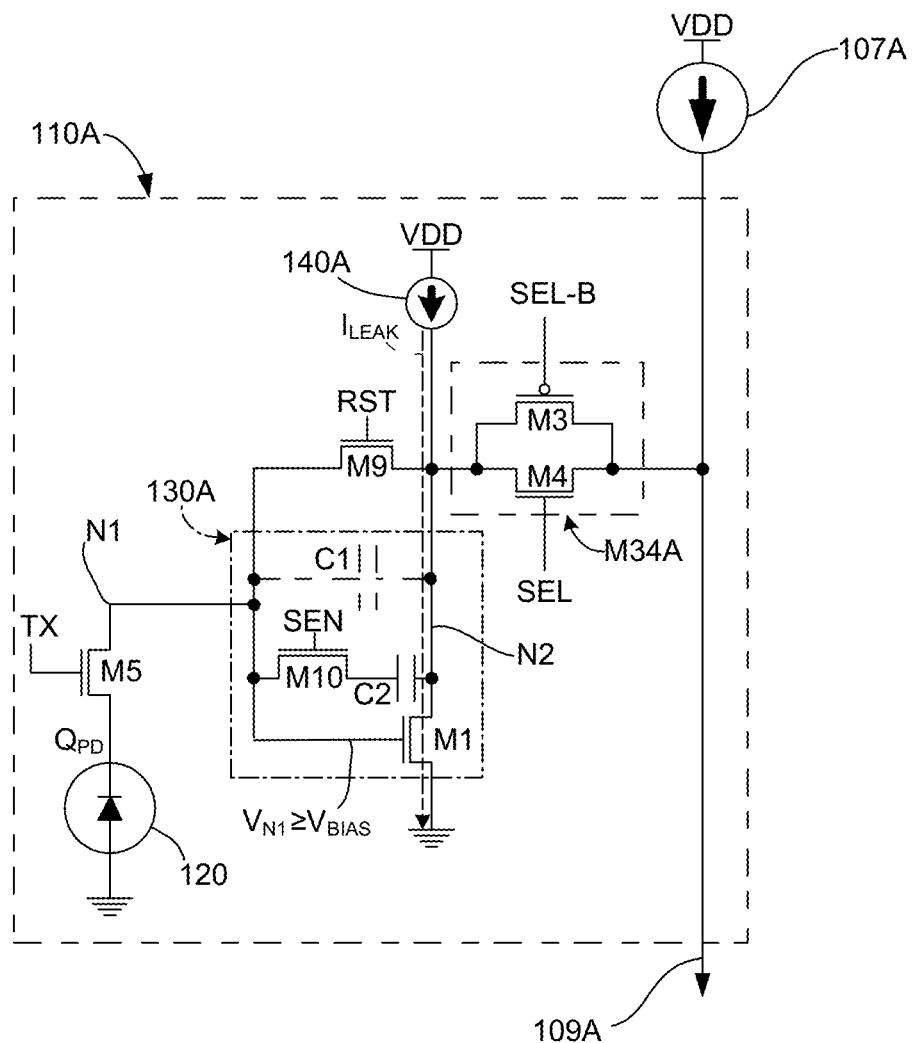
FIG. 2 is a simplified circuit diagram showing a pixel of a CMOS image sensor according to a specific embodiment of the present invention.
Figure 3A:
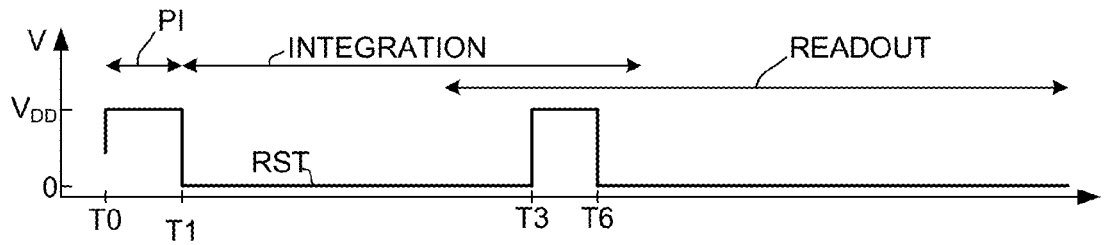
FIGS. 3(A), 3(B), 3(C), 3(D) and 3(E) are timing diagrams showing control signals transmitted to the pixel of FIG. 2 during operation.
Figure 3B:
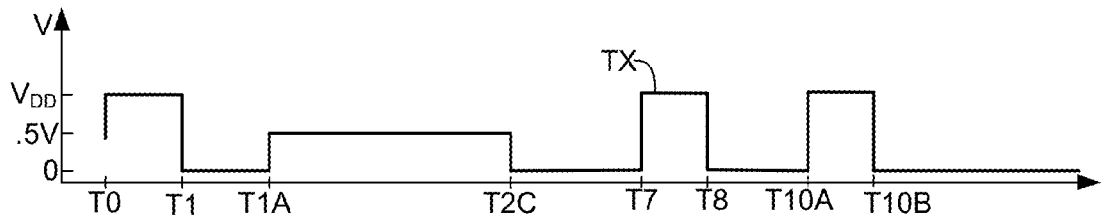
Figure 3C:
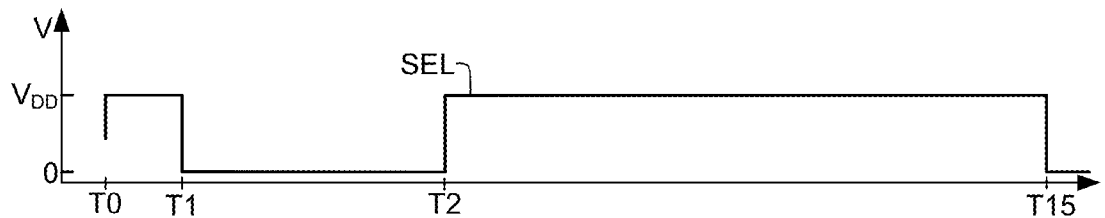
Figure 3D:
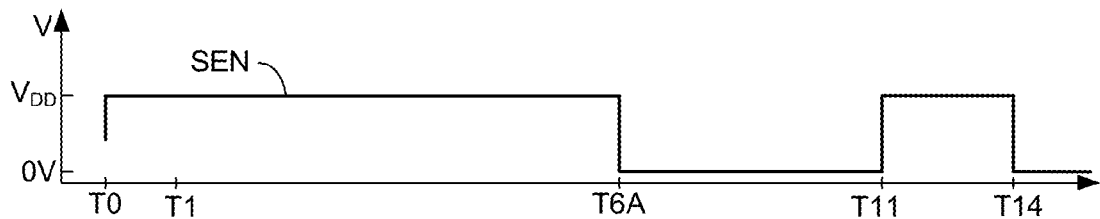

FIG. 2 is a simplified circuit diagram showing a pixel 110A of a CMOS image sensor formed in accordance with a specific embodiment of the present invention. Pixel 110A is utilized, for example, in place of pixel 110-13 in FIG. 1, and is addressed by corresponding control/readout circuitry similar to that described above with reference to FIG. 1, and operates in conjunction with applied control signals RST, TX, SEN and SEL according to the timing diagrams shown in FIGS. 3(A) to 3(D) to facilitate pre-integration, integration and readout phases, which are performed during each integration/readout cycle and described in additional detail below. Similar to generalized pixel 110-13 (FIG. 1), pixel 110A includes a photodiode 120 coupled to FD node N1 by way of an NMOS transfer gate M5, which is controlled by a transfer gate control signal TX having a voltage level that changes as shown in FIG. 3(B) during each integration/readout cycle, an NMOS charge amplifier 130A that is coupled to signal line 109A by way of a select switch M34A and includes both a relatively small (high sensitivity) capacitor C1 connected to FD node N1, and a relatively large (low sensitivity) conversion capacitor C2 that is coupled to FD node N1 by way of an NMOS mode control switch M10, which is controlled by a mode control signal SEN having a voltage level that changes as shown in FIG. 3(D) during each integration/readout cycle. Pixel 110A differs from pixel 110-13 in that select switch M34A of pixel 110A is implemented by an NMOS transistor M4 connected in parallel with a PMOS transistor M3, where a select control signal SEL (e.g., described below with reference to FIG. 3(C)) is applied to the gate terminal of NMOS transistor M4, and control signal SEL-B (i.e., "SEL-bar", or the inverse of control signal SEL) is applied to both the gate terminal of PMOS transistor M3. Note that select control signal SEL is generated with a voltage level that changes as shown in FIG. 3(C) during each integration/readout cycle. In addition, charge amplifier 130A differs from generalized pixel 110-13 (shown in FIG. 1) by including an NMOS reset transistor M9 and a bias circuit 140A. Reset transistor M9 is connected in parallel with charge amplifier 130A between nodes N1 and N2 (i.e., between select switch M34A and the gate terminal of NMOS amplifier transistor M1), and is controlled by a reset control signal RST that changes as shown in FIG. 3(A) during each integration/readout cycle. Bias circuit 140A, which in this embodiment is implemented by a current source that generates a small leakage current $I_{LEAK}$ on pixel output node N2 that passes through NMOS amplifier transistor M1. The function of bias circuit 140A is to maintain FD node voltage $V_{N1}$ on FD node N1 at least at a minimum bias voltage $V_{BIAS}$ such that NMOS amplifier transistor M1 is at least partially on to prevent leakage through transfer gate M5 during the integration phase.

Figure 3E:
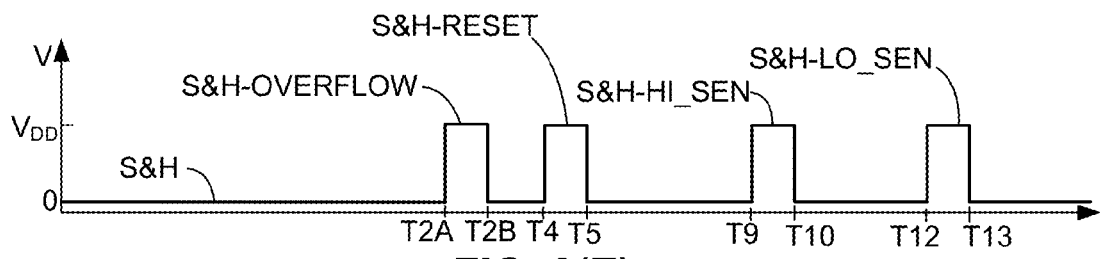

FIGS. 3(A) to 3(E) are simplified timing diagrams depicting the various control signals utilized to control pixel 110A (FIG. 2) during each integration/readout cycle. Specifically, FIGS. 3(A) to 3(D) show exemplary signal levels for control signals RST, TX, SEL and SEN, respectively, that are applied to the gate terminals of reset transistor M9, transfer gate M5, select switch M34A, and mode control switch M10, respectively, during each integration/readout cycle, and FIG. 3(E) shows a simplified exemplary sample/hold control signal S&H utilized by the sensor's readout circuit (e.g., circuit 102B in FIG. 1) during the readout phase. As indicated at the top of FIG. 3(A), each integration/readout cycle performed by pixel 110A includes a pre-integration (PI) phase, an integration phase, and the readout phase that overlaps a terminal portion of the integration phase. These operating phases are described below with reference to FIGS. 4(A) to 4(F), which show corresponding operating states of the various transistors of pixel 110A during the associated operating phases.

Figure 4A:
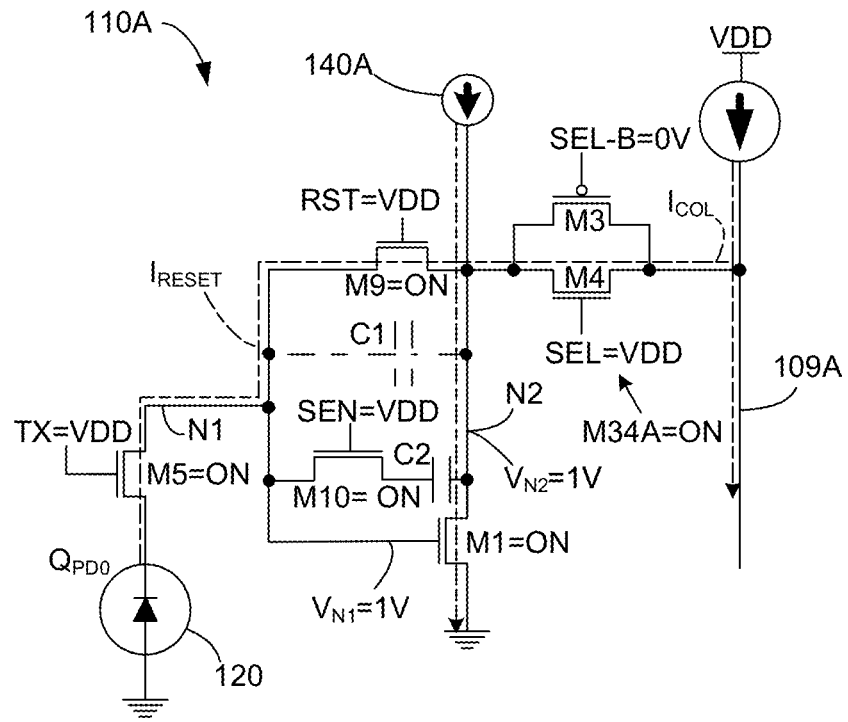
FIGS. 4(A), 4(B), 4(C), 4(D), 4(E) and 4(F) are simplified circuit diagrams showing operating states within the pixel of FIG. 2 during operation.

FIGS. 4(A) depicts pixel 110A during the pre-integration phase while reset control signal RST, transfer gate control signal TX, select control signal SEL, and mode control signal SEN are toggled high as indicated at time T0 to T1 in FIGS. 3(A) to 3(D). As indicated in FIG. 4(A), these high control signals actuate (turn on) select switch M34A, transfer gate M5, reset transistor M9 and mode control switch M10, thereby coupling nodes N1 and N2 to photodiode 120 and signal line 109A. In this operating state the gate and source voltages applied to amplifier transistor M1 are equal (e.g., both node voltages $V_{N1}$ and $V_{N2}$ are maintained at 1V), which causes the NMOS amplifier transistor M1 to function as a diode that produces a reset current $I_{RESET}$ between photodiode 120 and ground through amplifier transistor M1, thereby resetting photodiode 120 to an initial charge $Q_{PD0}$. The equal node voltages $V_{N1}$ and $V_{N2}$ also produce a zero voltage drop across capacitors C1 and C2, thereby also resetting capacitors C1 and C2 to initial charges QC1-PD0 and QC2-PD0. This reset phase approach provides an advantage over conventional systems that implement reset using VDD or other higher voltages at least in that resetting photodiode 120 is achieved using a limited column current (i.e., only a small amount of column current $I_{COL}$, flows from signal line 109A through select switch M34), so a large current spike while resetting a row of pixels is prevented (this is especially important in large arrays).

Figure 4B:
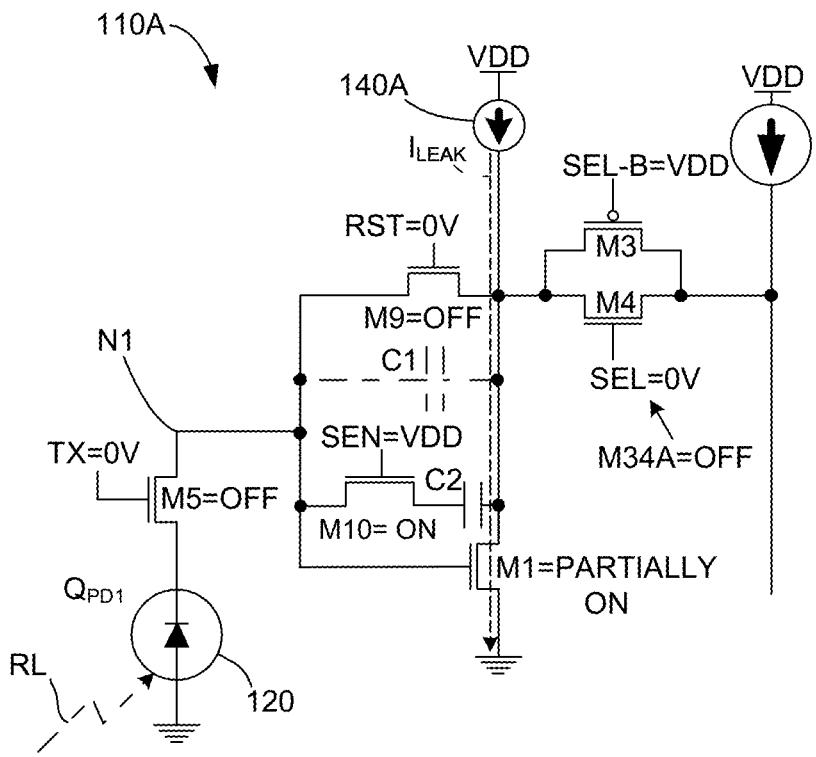

FIGS. 4(B) depicts pixel 110A during the initial portion of the integration phase. Referring again to FIGS. 3(A) to 3(D), at the beginning of the integration phase (at time T1), each of reset control signal RST, transfer gate control signal TX, and select control signal SEL are toggled low, but mode control signal SEN remains high. Referring to FIG. 4(B), the de-asserted (0V) control RST, TX and SEL control signals cause select switch M34A, transfer gate M5, and reset transistor M9 to turn off. With transfer gate M5 turned off, photodiode 120 is isolated and thus photodiode charge $Q_{PD1}$ begins to increase at a rate determined by the amount of received light RL directed onto photodiode 120. That is, when the flux of received light RL is low (i.e., dim or zero light is directed onto pixel 120), photodiode charge $Q_{PD1}$ increases at a relatively low rate. Conversely, when the amount of received light RL is high (i.e., bright light is directed onto pixel 120), photodiode charge $Q_{PD1}$ increases at a relatively fast rate. Note that control signal SEN remains high during this time, whereby capacitor C2 remains operatively coupled to FD node N1. As indicated in FIG. 4(B), with reset transistor M9 and select switch M34A turned off, leakage current $I_{LEAK}$ generated by bias circuit 140A through amplifier transistor M1 functions to maintain bias voltage $V_{BIAS}$ on FD node N1, whereby NMOS amplifier transistor M1 is reliably turned on to prevent leakage through transfer gate M5 during at least a portion of the integration phase.

Figure 4C:
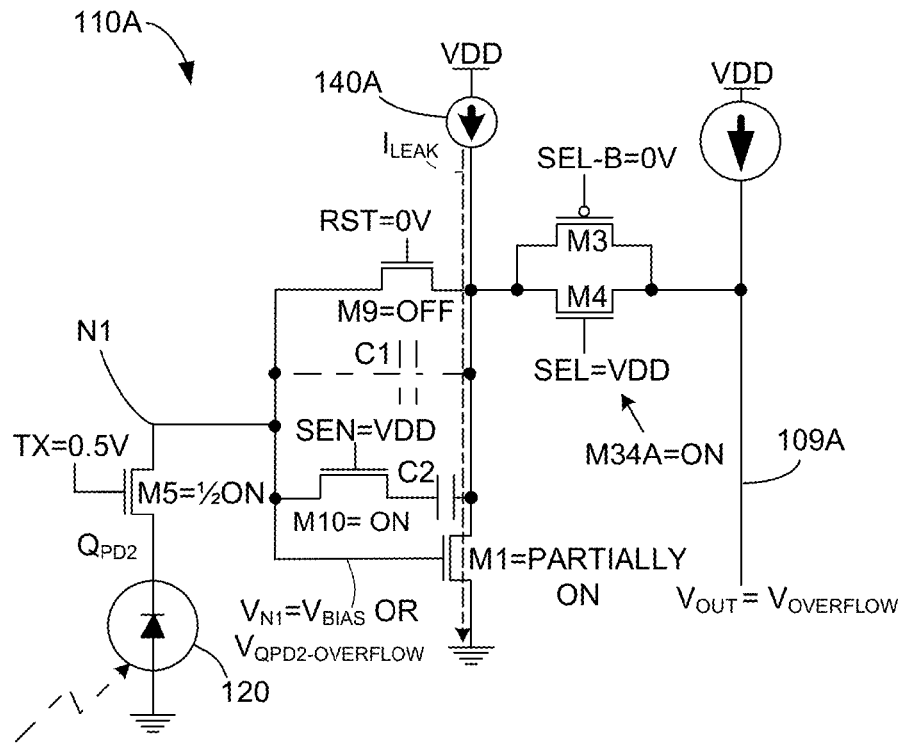

FIG. 4(C) depicts pixel 110A during the overflow readout phase, which occurs in a later portion of the integration phase that overlaps with an early stage of the multi-phase readout operation. According to an aspect of the invention, the overflow readout phase beneficially utilizes the relatively large capacitance of conversion capacitor C2 as an overflow capacitor to both provides an accurate measurement of a large photodiode charge that would otherwise exceed/overflow photodiode 120, and also to prevent the overflow charge from penetrating neighboring pixels. Both of these benefits are achieved by way of operatively coupling conversion capacitor C2 to FD node N1, and by setting the operating state of transfer gate M5 at a level that allows portions of large photodiode charges to "spill" into FD node N1. Referring to FIG. 3(D), because mode control signal SEN remains high after the pre-integration phase and though most of the integration phase, conversion capacitor C2 remains operatively coupled to FD node N1 during overflow readout phase. Referring to FIG. 3(B), the operating state of transfer gate M5 is set to allow spilling of charge into FD node N1 by way of setting transfer gate control signal to an intermediate voltage level at time T1A. The phrase "intermediate voltage level" is used to define a transfer gate voltage that is between fully-on gate voltage (e.g., 1V) and a fully-off gate voltage (e.g., 0V), and may be set midway between the fully-on and fully-off gate voltages (e.g., 0.5V). As indicated in FIG. 4(C), the intermediate gate voltage (e.g., TX=0.5V) causes transfer gate M5 to partially turned on (i.e., such that transfer gate M5 generates a partial potential barrier that contains smaller photodiode charges in photodiode 120, but allows leakage of larger photodiode charges into FD node N1). The level of the intermediate potential barrier generated by partially-on transfer-gate M5, which is determined by the intermediate gate voltage of control signal TX, is selected such that, when photodiode charge $Q_{PD2}$ increases at a relatively slow rate (i.e., a rate that would not saturate/overflow photodiode 120 by the end of the integration phase), then the intermediate potential barrier is sufficient to prevent any charge from spilling out of photodiode 120 into FD node N1, whereby FD node voltage VN1 remains at $V_{BIAS}$. Conversely, the level of the intermediate potential barrier generated by partially-on transfer-gate M5 is also selected such that, when photodiode charge $Q_{PD2}$ increases at a rate that would saturate (overflow) photodiode 120 by the end of the integration phase, then this overflow charge (i.e., the amount of charge exceeding the intermediate potential barrier while transfer gate M5 is partially turned on) spills into FD node N1, thus increasing FD node voltage $V_{N1}$ above the minimum bias voltage to a level indicated in FIG. 4(C) as $V_{QPD2-OVERFLOW}$. Referring to FIG. 3(C), at time T2 (while transfer gate control signal TX is at the intermediate voltage level), select control signal SEL is toggled high to actuate (turn on) select switch M34A (as indicated in FIG. 4(C)), whereby overflow readout signal $V_{OVERFLOW}$ is generated on signal line 109A (i.e., $V_{OUT}=V_{OVERFLOW}$) whose signal value (voltage level) is generated in accordance with the gate voltage applied from node N1 to NMOS amplifier transistor M1. That is, overflow readout signal $V_{OVERFLOW}$ either has a minimum value generated by the application of bias voltage $V_{BIAS}$ to the gate terminal of amplifier transistor M1 at reset, or a higher value determined by lower overflow readout voltage $V_{QPD2-OVERFLOW}$. Next, as indicated in FIG. 3(E), an overflow sample/hold readout operation "S&H-OVERFLOW" is performed between time T2A and T2B to capture/store overflow readout signal $V_{OVERFLOW}$. Referring again to FIG. 3(B), at the end of the overflow readout phase (time T2C), transfer gate control signal TX is again de-asserted (i.e., decreased from its intermediate voltage level to ground/0V), thereby actuating (turning off) transfer gate M5 to again isolate photodiode 120.

As set forth in the example above, because relatively large conversion capacitor C2 is operatively coupled to FD node N1 during the overflow readout phase, conversion capacitor C2 serves as an overflow capacitor that facilitates measuring, by way of overflow readout voltage level $V_{QPD2-OVERFLOW}$, the amount of overflow charge spilling out of photodiode 120, which facilitates accurately determining the total amount of light received by pixel 110A when the total photodiode charge would otherwise saturate photodiode 120. In addition, by preventing the photodiode charge from exceeding the potential barrier of partially-on transfer gate M5 during most of the integration phase, the overflow readout operation also prevents overflow charges from exceeding the capacity of photodiode 120 and penetrating adjacent pixels.

Figure 4D:
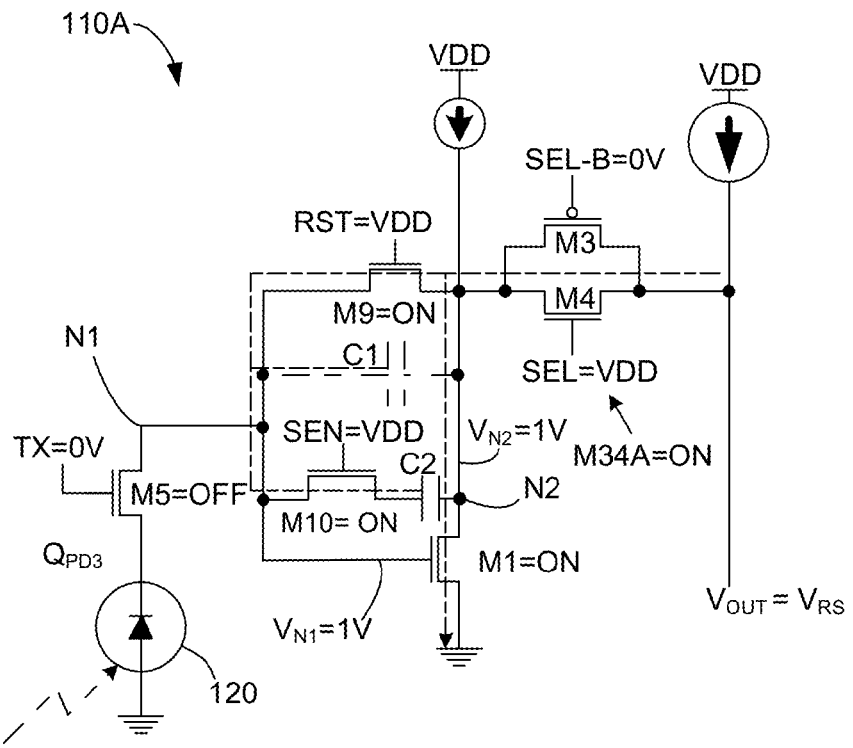

FIGS. 4(D) depict pixel 110A during a later portion of integration period during which a reset readout operation is performed to read a "reset level" value of pixel 110A, which is utilized to facilitate correlated double sampling (CDS) readout values during subsequent readout processing (discussed below). Referring again to FIGS. 3(B), 3(C) and 3(D), during the reset readout phase (i.e., between times TC2 and T8) transfer gate control signal TX remains low, and both select control signal SEL and mode control signal SEN remain high. As indicated in FIG. 4(D), the de-asserted transfer gate control signal TX isolates photodiode 120 to prevent transfer of photodiode charge $Q_{PD3}$ to FD node N1 at this time. In addition, the asserted control signal SEL maintains select switch M34A in a fully-on operating state, whereby node N2 is operatively coupled to signal line 109A, and the asserted control signal SEN maintains mode control transistor M10 in a fully-on operating state, whereby conversion capacitor C2 remains operatively coupled to FD node N1. Referring to FIG. 3(A), at time T3 reset control signal RST toggles high, which actuates (turns on) reset transistor M9 as shown in FIG. 4(D), thereby operatively coupling FD node N1 to pixel output node N2 such that both node voltages $V_{N1}$ and $V_{N2}$ are again set at 1V. As during the pre-integration phase (discussed above), this operating state causes NMOS amplifier transistor M1 to again function as a diode, whereby any charges stored on capacitors C1 and C2 during the overflow readout phase are passed to ground, as indicated in FIG. 4(D) by the dashed line arrows. A reset sample/hold operation "S&H-RESET" is performed between time T4 and T5 (see FIG. 3(E)) and the resulting "reset level" output signal $V_{RS}$ generated on signal line 109A is read and stored while reset control signal RST is asserted, and then reset control signal RST is toggled low (time T6, FIG. 3(A)). The reset readout phase also serves the purpose of removing any charges that might have been stored on capacitors C1 and C2 during the overflow readout phase, whereby capacitors C1 and C2 are reliably set at their reset values at the end of the reset readout phase. Note that the "reset level" output signal $V_{RS}$ varies from pixel to pixel due to threshold voltage variations from pixel to pixel of the NMOS amplifier transistors. However, performing a reset read operation after the overflow readout phase and before the high sensitivity and low sensitivity readout phases provides a correlated pixel value (i.e., the difference between each signal-level readout signal and the reset-level of reset readout signal $V_{RS}$). That is, a higher diode voltage (reset-level value) will result in a higher signal-level values (i.e., the overflow and high/low sensitivity readout signals) for the same amount of light collected by a given photodiode, and a lower diode voltage will result in lower signal-level values for the same amount of light collected by that photodiode.

Figure 4E:
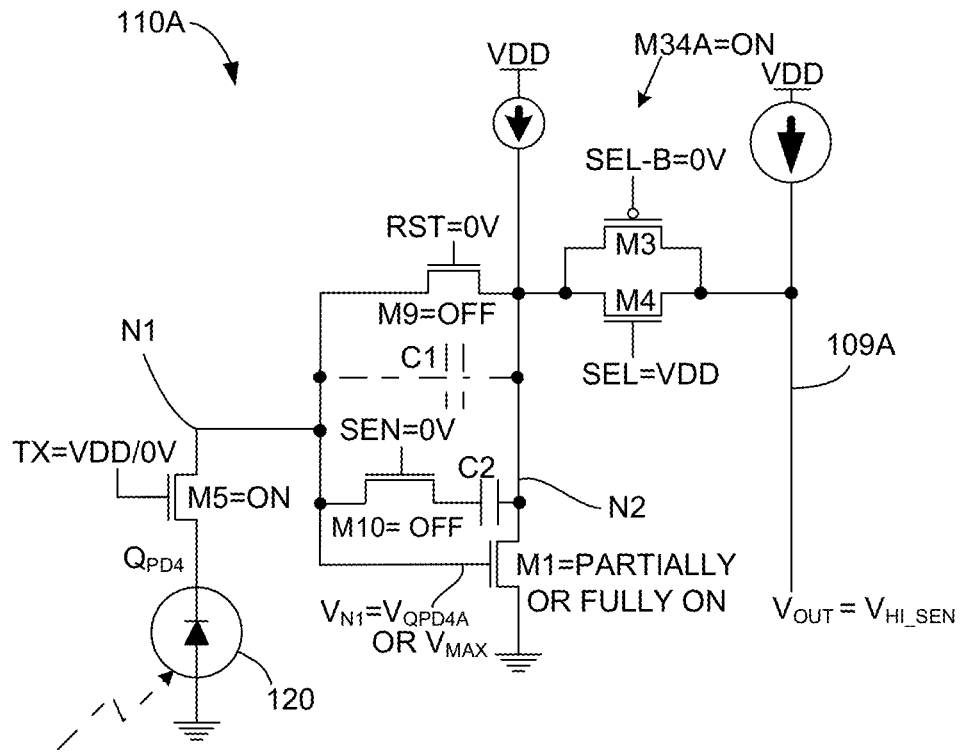
Figure 4F:
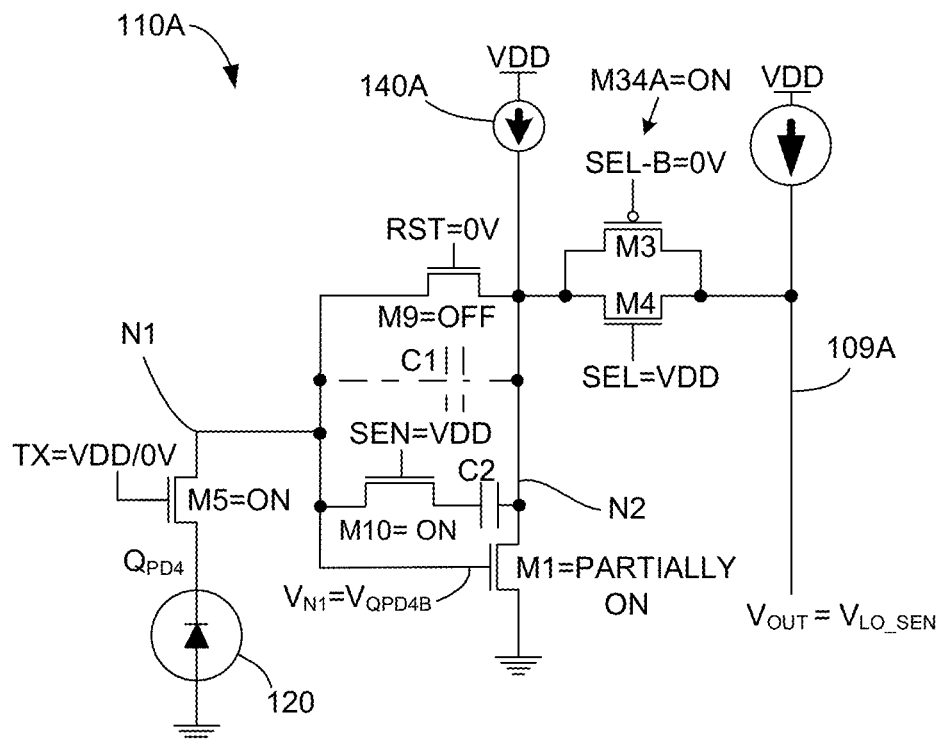

Referring to FIGS. 4(E) and 4(F), the multi-phase readout operation then continues at the end of the integration phase by reading signal-level values associated with a final version of the photodiode charge present on photodiode 120 the end of the integration phase. As mentioned above, this final photodiode charge is read twice: once during the high sensitivity readout phase described below with reference to FIG. 4(E), and once during the low sensitivity readout phase described below with reference to FIG. 4(F).

The high sensitivity readout phase measures the final photodiode charge a first time with only capacitor C1 operatively coupled to FD node N1, which is achieved by de-asserting mode control signal SEN at time T6A, whereby, as shown in FIG. 4(E), mode control switch M10 is actuated (turned off) to de-couple capacitor C2 to FD node N1. When mode control switch M10 turns off, mode control switch M10 isolates FD node N1 from capacitor C2, and the effectively capacity of FD node N1 is determined only by the capacity of capacitor C1. At time T7 control signal TX is then asserted to actuate (turn on) transfer gate M5 such that photodiode 120 is operably coupled to FD node N1 such that a portion of the final photodiode charge is transferred to and stored on capacitor C1. A predetermined time period is allowed for transferring the photodiode charge to capacitor C1, and then at time T8 transfer gate control signal TX is de-asserted to turn off transfer gate M5 (as shown in FIG. 3(B)), thereby operatively de-coupling photodiode 120 from FD node N1. Thereafter, the FD node voltage $V_{N1}$ generate by the charge stored on capacitor C1 controls NMOS amplifier transistor M1 to generate a high sensitivity readout signal $V_{HI\_SEN}$ on signal line 109A in the manner described above. Referring to FIG. 3(E), a high sensitivity sample/hold operation S&H-HI_SEN is then performed between times T9 and T10 during which high sensitivity readout signal $V_{HI\_SEN}$ is read and stored.

According to an aspect of the present invention, the amount of charge transferred from photodiode 120 to FD node N1 during the high sensitivity readout phase is limited by the charge capacity of capacitor C1. That is, because the total effective capacitance of FD node N1 during high sensitivity readout is limited to the relatively small capacity of capacitor C1, FD node (readout) voltage $V_{N1}$ only varies in accordance (e.g., linearly changes) with different final photodiode charges when the final photodiode charges do not saturate (fill to capacity) capacitor C1 during high sensitivity readout. As such, FD node voltage $V_{N1}$ has a value $V_{QPD4A}$ that varies significantly for different photodiode charges when those photodiode charges are below the charge capacity of capacitor C1, but FD node voltage $V_{N1}$ becomes "pegged" (i.e., generated at a fixed maximum value, which is referred to herein as maximum voltage $V_{MAX}$) for all photodiode charges that exceed the charge capacity of capacitor C1. Accordingly, high sensitivity readout signal $V_{HI\_SEN}$ provides very precise image data for small photodiode charges, but does not provide detailed information for larger photodiode charges.

The low sensitivity (third) readout phase is then performed to measure the final photodiode charge a second time using both capacitors C1 and C2 operatively coupled to FD node N1. Referring to FIG. 3(D), mode control signal SEN is asserted at the beginning of the low sensitivity readout phase (time T11), which, as shown in FIG. 4(F), actuates (turns on) mode control switch M10 to couple capacitor C2 to FD node N1. With mode control switch M10 turned on, the capacity of FD node N1 is now determined by the combined capacities of capacitors C1 and C2, which are preferably made large enough to store a maximum remaining charge that might be transferred from photodiode 120. Referring to FIG. 3(B), transfer gate control signal TX is next re-asserted at time T10A, which actuates (turns on) transfer gate M5 to couple photodiode 120 to capacitors C1 and C2 by way of FD node N1, whereby final photodiode charge $Q_{PD4}$ (i.e., the remaining photodiode charge at time T10A) generates charge portions on capacitors C1 and C2, thereby generating an associated FD node (readout) voltage $V_{QPD4B}$ on the gate terminal of amplifier transistor M1. A predetermined time period is allowed for transferring photodiode charge $Q_{QPD4B}$ to capacitors C1 and C2, and then at time T10B transfer gate control signal TX is de-asserted to turn off transfer gate M5, thereby operatively de-coupling photodiode 120 from FD node N1. The charges stored on capacitors C1 and C2 thereafter maintain FD node N1 at a voltage level $V_{QPD4B}$, which corresponds with the amount of photodiode charge captured by photodiode 120 during the integration phase, whereby amplifier transistor M10 is turned on in accordance with final photodiode charge $Q_{PD4}$ stored on photodiode 120 to generate low sensitivity readout signal $V_{LO\_SEN}$ on signal line 109A. A low sensitivity sample/hold operation S&H-LO_SEN is performed between times T12 and T13 (see FIG. 3(E)) while mode control signal SEN remains high (i.e., mode control switch M10 remains turned on). Subsequently, mode control signal SEN is de-asserted at time T14 (FIG. 3(D)), and then select control signal SEL is subsequently de-asserted (time T15; see FIG. 3(C)) to end the multi-phase readout operation.

According to another aspect of the present invention, a final HDR image value is generated at the end of each integration/readout cycle utilizing at least one of the three readout signals (or associated stored image data values) produced during the multi-phase readout operation described above. Referring to the lower left portion of FIG. 1, in one embodiment readout circuit 102B is configured to read and store overflow readout signal $V_{OVERFLOW}$ (block 211) during the overflow readout phase, to read and store high sensitivity readout signal $V_{HI\_SEN}$ (block 212) during the high sensitivity readout phase, and to read and store low sensitivity readout signal $V_{LO\_SEN}$ (block 214) during the low sensitivity readout phase, where these readout phases are performed, for example, in accordance with the processes described above with reference to FIGS. 4(C) to 4(F). Next, a final HDR image value is generated using image data values based on readout signals $V_{OVERFLOW}$, $V_{HI\_SEN}$ and $V_{LO\_SEN}$ (block 216) according to a predetermined signal processing technique. For example, in the absence of overflow conditions, the final HDR image value is generated by adjusting one or more of the high sensitivity readout signal $V_{HI\_SEN}$ and low sensitivity readout signal $V_{LO\_SEN}$ in accordance with a predetermined weighting formula, and then combining the adjusted associated image data values to generate final HDR image value as a weighted average over the associated light range. According to an alternative signal processing technique, the high sensitivity readout signal $V_{HI\_SEN}$ is utilized (alone) as the final HDR image value when low-light conditions are detected (i.e., when zero overflow is detected and a non-maximum high sensitivity readout signal is generated, indicating a photodiode charge below a predetermined light threshold), and low sensitivity readout signal $V_{LO\_SEN}$ is utilized as the final HDR image value for non-overflow photodiode charge levels above the predetermined light threshold. When an overflow condition is detected, the final HDR image value may be generated by summing the overflow readout value $V_{OVERFLOW}$ with the remaining charge determined by one or both of high sensitivity readout signal $V_{HI\_SEN}$ and low sensitivity readout signal $V_{LO\_SEN}$.

Figure 5:
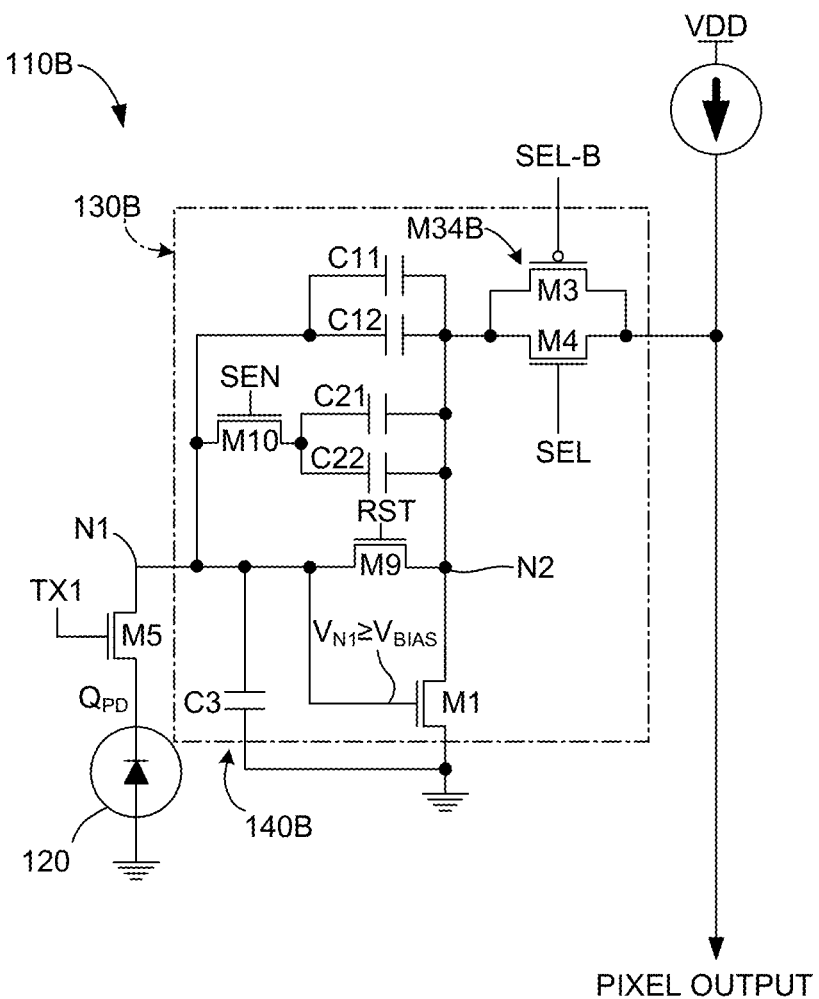
FIG. 5 is simplified circuit diagrams showing a pixel of a CMOS image sensor according to other specific embodiment of the present invention.

FIG. 5 is a simplified circuit diagram showing a pixel 110B according to another exemplary embodiment in which a charge amplifier 130B is provided with an alternative capacitor arrangement and an alternative bias circuit 140B. Pixel 110B is otherwise substantially identical to pixel 110A (described above) in that pixel 110B includes a select switch M34B, an NMOS amplifier transistor M1, an NMOS transfer gate M5, and a reset transistor M9 that are arranged and operate substantially as described above.

Referring to the upper portion of FIG. 5, the alternative capacitor arrangement of charge amplifier 130B is provided by two high sensitivity discrete (e.g., MOS or MiM) capacitors C11 and C12 that are connected in a back-to-back (parallel) arrangement between the drain and gate terminals of NMOS transistor M1 (e.g., between the signal line 109-1 and photodiode 120), and two high-sensitivity discrete capacitors C21 and C22 that are connected in a back-to-back (parallel) arrangement between mode control switch M10 and the drain of NMOS transistor M1. By implementing the high sensitivity and conversion capacitors using two or more parallel discrete capacitors in the arrangement shown in FIG. 5, CMOS image sensors formed in accordance with present invention exhibit excellent voltage linearity on pixel output voltage $V_{OUT}$, compared to conventional pixels that use diode capacitance for charge integration, or compared to embodiments of the present invention that use single capacitors to provide the high sensitivity and conversion capacitances.

Referring to the lower portion of FIG. 5, alternative bias circuit 140B is implemented using a discrete capacitor C3 that is connected by conductors between FD node N1 and system ground. This arrangement forms a capacitor divider such that, while the common source drain goes to zero, FD node N1 is maintained above 0V, thereby generating the desired bias voltage $V_{BIAS}$ on the gate terminal of amplifier transistor M1.

Figure 6:
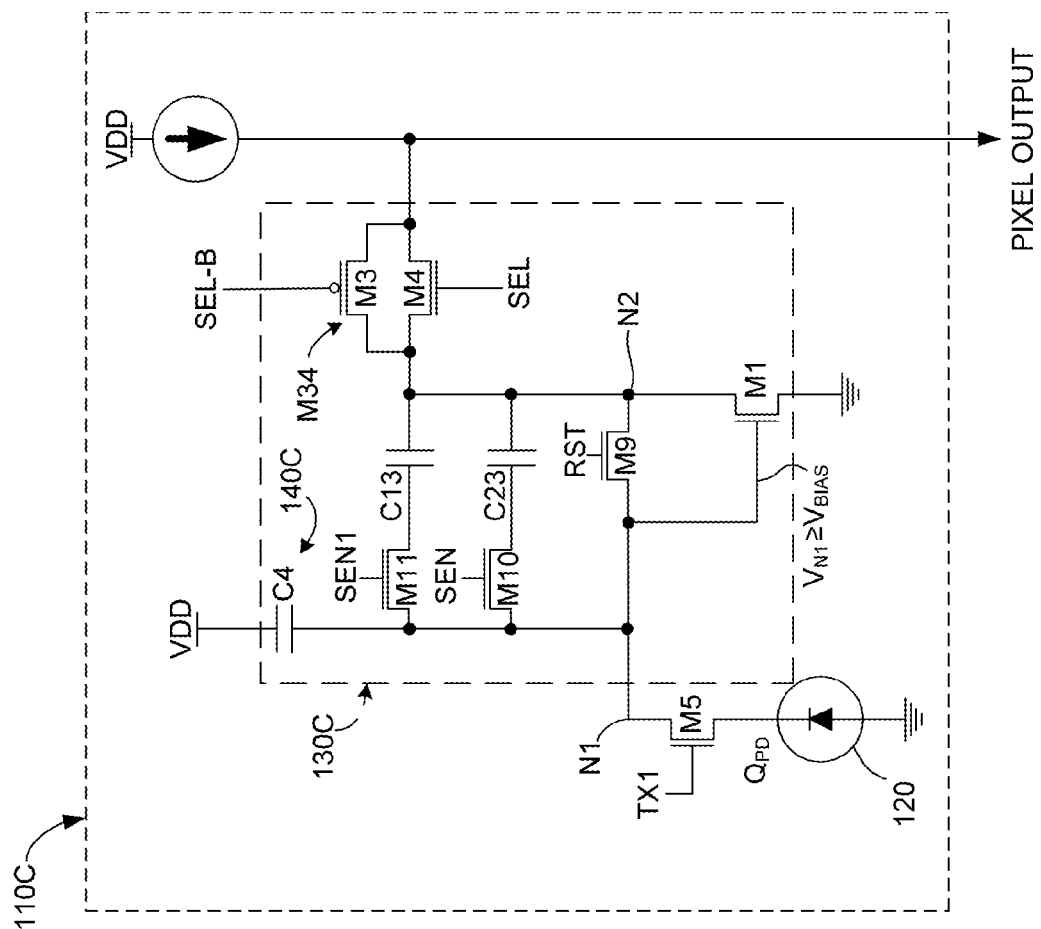
FIG. 6 is simplified circuit diagrams showing a pixel of a CMOS image sensor according to other specific embodiment of the present invention.

FIG. 6 is a simplified circuit diagram showing a pixel 110C formed in accordance with another exemplary embodiment having a charge amplifier 130C including a switchable high sensitivity capacitive arrangement and yet another exemplary bias circuit 140C. Pixel 110C is otherwise substantially identical to pixel 110A (described above) in that pixel 110B includes a select switch M34B, an NMOS amplifier transistor M1, an NMOS transfer gate M5, and a reset transistor M9 that are arranged and operate substantially as described above.

As indicated in FIG. 6, the alternative capacitor arrangement of charge amplifier 130C includes an additional mode control switch M11 connected between FD node N1 and high sensitivity capacitor C13 and controlled by a separate mode control signal SEN1 in order to selectively isolate capacitor C1, for example, during the low sensitivity readout phase. Note that low sensitivity capacitor C23 remains coupled between nodes N1 and N2 by way of mode control switch M10, which is controlled by mode control signal SEN in the manner describe above.

Referring to the upper left portion of FIG. 6, alternative bias circuit 140C is implemented using a discrete capacitor C4 that is connected by conductors between FD (first) node N2 and system voltage VDD. This arrangement operates similar to the capacitor divider approach of bias circuit 140B (discussed above) to maintained FD node N1 above 0V, thereby maintaining the gate terminal of amplifier transistor M1 at minimum bias voltage $V_{BIAS}$.

Although the present invention has been described with respect to certain specific embodiments, it will be clear to those skilled in the art that the inventive features of the present invention are applicable to other embodiments as well, all of which are intended to fall within the scope of the present invention. For example, although the exemplary embodiment describes generating transfer gate control signal using three voltage levels (e.g., 0V, 0.5V and 1V), multi-phase readout operations similar to those described above may be implemented using only two voltages (e.g., an intermediate voltage such as 0.5V and a high voltage such as 1V). Note that the charged/discharged state of the photodiodes is described herein with reference to electron charges, where the photodiodes are initially "discharged" by way of removing electrons, and "charged" during integration by way of collecting electrons from the incident light.

The invention claimed is:

1. A CMOS image sensor comprising:
   a plurality of pixels, wherein each pixel includes:
      a photodiode;
      a transfer gate coupled between the photodiode and a first node;
      a charge amplifier coupled between the first node and a second node, the charge amplifier including:
         a charge-to-voltage conversion capacitor having a first terminal connected to the second node; and
         a mode control switch connected between the first node and a second terminal of the conversion capacitor; and
   a control circuit configured to control the mode control switch and the transfer gate to measure a photodiode charge generated on the photodiode during a single integration/readout cycle such that:
      during a first readout phase of the single integration/readout cycle, the mode control switch is actuated to operatively de-couple the conversion capacitor from the first node, and the transfer gate is actuated such that a first readout voltage is generated on the first node in accordance with the photodiode charge; and
      during a second readout phase of the single integration/readout cycle, the mode control switch is actuated to operably couple the conversion capacitor to the first node, and the transfer gate is actuated, whereby a second readout voltage generated on the first node is at least partially stored on the conversion capacitor.

2. The CMOS image sensor of claim 1, further comprising at least one current source configured to generate a predetermined signal current on a signal line,
   wherein each said pixel further comprises a select switch connected between the signal line and the second node, and
   wherein the charge amplifier of each said pixel includes an amplifier transistor having a first terminal connected to the second node, a second terminal connected to a first voltage source, and a gate terminal connected to the first node,
   wherein during the first readout phase, the select switch is actuated to operably couple the signal line to the second node, whereby a first readout signal is generated on the signal line in accordance with the first readout voltage, and
   wherein during the second readout phase, the select switch is actuated to couple the signal line to the second node, whereby a second readout signal is generated on the signal line in accordance with the second readout voltage.

3. The CMOS image sensor of claim 2, wherein the control circuit is configured to generate said first readout signal and said second readout signal after an integration phase of the single integration/readout cycle, whereby the first readout voltage is generated on the first node in accordance with a final version of said photodiode charge while the conversion capacitor is operatively de-coupled from the first node, and the second readout voltage is generated on the first node in accordance with the final version of the photodiode charge while the conversion capacitor is operatively coupled to the first node.

4. The CMOS image sensor of claim 2, wherein the control circuit is configured to generate said second readout signal during an integration phase of the single integration/readout cycle while a partial version of the photodiode charge is generated on said photodiode, and said control circuit is further configured to generate said first readout signal after said integration phase when a final photodiode charge is generated on said photodiode, whereby the second readout voltage is generated on the first node in accordance with the partial version of the photodiode charge while the conversion capacitor is operatively coupled to the first node, and the first readout voltage is subsequently generated on the first node in accordance with the final version of the photodiode charge while the conversion capacitor is operatively de-coupled from the first node.

5. The CMOS image sensor of claim 4,
wherein each said pixel includes a bias circuit configured to generate a continuous nominal bias voltage on the first node, and
wherein the control circuit is configured to actuate the transfer gate by generating an intermediate transfer gate control voltage such that the transfer gate is partially turned on during the second readout phase, whereby the second readout voltage generated on the first node is one of (a) the continuous nominal bias voltage when the partial version of the photodiode charge is less than a predetermined charge value, and (b) an overflow readout voltage proportional to an amount by which the partial version of the photodiode charge exceeds the predetermined charge value.

6. The CMOS image sensor of claim 5, wherein the bias circuit comprises a current source configured to generate a leakage current from the second node through the amplifier transistor.

7. The CMOS image sensor of claim 5, wherein the bias circuit comprises a capacitor connected between the first node and the first voltage source.

8. The CMOS image sensor of claim 5, wherein the bias circuit comprises a capacitor connected between the first node and a system voltage source.

9. The CMOS image sensor of claim 5, wherein control circuit is further configured to control the mode control switch, the transfer gate and the select switch such that, during a third readout phase performed after said first readout phase, the mode control switch is controlled to operably couple the conversion capacitor to the first node, the select switch is actuated to couple the signal line to the second node, and the transfer gate is actuated such that a third readout voltage is generated on the first node in accordance with the final version of the photodiode charge while the conversion capacitor is operatively coupled to the first node, whereby a third readout signal is generated on the signal line in accordance with the third readout voltage.

10. The CMOS image sensor of claim 9, further comprising a readout circuit configured to generate a final HDR image value by summing the second readout signal with at least one of said first readout signal and said third readout signal.

11. The CMOS image sensor of claim 2,
wherein each said pixel further comprising a reset transistor connected between the first and second nodes, and
wherein the control circuit is further configured to actuate said reset transistor, said select switch and said transfer gate during a reset phase prior to an integration phase of the single integration/readout cycle, whereby said photodiode is coupled to said signal line during said reset phase.

12. The CMOS image sensor of claim 1,
wherein the mode control switch comprises an NMOS transistor and the conversion capacitor comprises a first discrete capacitor connected between the NMOS transistor and the second node, and
wherein the charge amplifier of each said pixel further comprises a second discrete capacitor connected between the first and second nodes.

13. The CMOS image sensor of claim 1,
wherein the capacitor comprises at least one first discrete capacitor;
wherein the mode control switch comprises a first NMOS transistor connected between the first discrete capacitor and the first node, and
wherein the charge amplifier of each said pixel further comprises:
a second discrete capacitor connected to the second node, and
a second NMOS transistor connected between the second discrete capacitor and the first node.

14. The CMOS image sensor of claim 1, wherein said plurality of pixels are arranged in a column such that each of said plurality of pixels is connected to said at least one current source by way of said signal line.

15. The CMOS image sensor of claim 1, wherein the photodiode of each said pixel comprises a partially pinned photodiode structure including an n-type implant formed in a P-type bulk region and a P-type pinning layer formed over a portion of the n-type implant where a region surrounding the anode contact is left without the pinning layer.

16. A CMOS image sensor comprising:
at least one current source for generating a predetermined signal current on a signal line; and
a first pixel including:
a photodiode;
a transfer gate coupled between the photodiode and a first node;
a select switch connected between the signal line and a second node; and
a charge amplifier coupled between the first node and the second node, the charge amplifier including:
a charge-to-voltage conversion capacitor having a first terminal connected to the second node;
an amplifier transistor having a first terminal connected to the second node, a second terminal connected to a first voltage source, and a gate terminal connected to the first node, and
a mode control switch connected between the first node and a second terminal of the conversion capacitor; and
a control circuit configured to control the mode control switch and the transfer gate to measure a photodiode charge generated on the photodiode during a single integration/readout cycle such that:
during a first readout phase of the single integration/readout cycle, the mode control switch is actuated to operatively de-couple the conversion capacitor from the first node, the select switch is actuated to operably couple the signal line to the second node, and the transfer gate is actuated such that a first readout voltage is generated on the first node, whereby a first readout signal is generated on the signal line in accordance with the first readout voltage; and during a second readout phase of the single integration/readout cycle, the mode control switch is controlled to operably couple the capacitor to the first node, the select switch is actuated to couple the signal line to the second node, the transfer gate is actuated such that a second readout voltage is generated on the first node, and the select switch is actuated to operably couple the signal line to the second node, whereby a second readout signal is generated on the signal line in accordance with the second readout voltage.

17. The CMOS image sensor of claim 16, wherein the control circuit is configured to generate said first readout signal and said second readout signal after an integration phase of the single integration/readout cycle, whereby the first readout voltage is generated on the first node in accordance with a final version of said photodiode charge while the capacitor is operatively de-coupled from the first node, and the second readout voltage is generated on the first node in accordance with the final version of the photodiode charge while the capacitor is operatively coupled to the first node.

18. The CMOS image sensor of claim 16, wherein the control circuit is configured to generate said second readout signal during an integration phase of the single integration/readout cycle while a partial version of the photodiode charge is generated on said photodiode, and said control circuit is further configured to generate said first readout signal after an integration phase of the single integration/readout cycle when a final photodiode charge is generated on said photodiode, whereby the second readout voltage is generated on the first node in accordance with the partial version of the photodiode charge while the capacitor is operatively coupled to the first node, and the first readout voltage is subsequently generated on the first node in accordance with the final version of the photodiode charge while the capacitor is operatively de-coupled from the first node.

19. The CMOS image sensor of claim 18,
wherein each said pixel includes a bias circuit configured to generate a continuous nominal bias voltage on the first node, and
wherein the control circuit is configured to actuate the transfer gate by generating an intermediate transfer gate control voltage such that the transfer gate is partially turned on during the second readout phase, whereby the second readout voltage generated on the first node is one of (a) the continuous nominal bias voltage when the partial version of the photodiode charge is less than a predetermined charge value, and (b) an overflow readout voltage proportional to the partial version of the photodiode charge when the partial version of the photodiode charge is greater than the predetermined charge value.

20. The CMOS image sensor of claim 19, wherein control circuit is further configured to control the mode control switch, the transfer gate and the select switch such that, during a third readout phase performed after said first readout phase, the mode control switch is controlled to operably couple the capacitor to the first node, the select switch is actuated to couple the signal line to the second node, and the transfer gate is actuated such that a third readout voltage is generated on the first node in accordance with the final version of the photodiode charge while the capacitor is operatively coupled to the first node, whereby a third readout signal is generated on the signal line in accordance with the third readout voltage.

* * * * *